(12) United States Patent
Yuan et al.

(10) Patent No.: US 11,519,975 B2
(45) Date of Patent: Dec. 6, 2022

(54) METHOD AND DEVICE FOR ELIMINATING OFFSET OF FLUXGATE MAGNETOMETER

(71) Applicant: Institute of Geology and Geophysics, Chinese Academy of Sciences, Beijing (CN)

(72) Inventors: Kaixin Yuan, Beijing (CN); Aiming Du, Beijing (CN); Ying Zhang, Beijing (CN); Lin Zhao, Beijing (CN); Shuquan Sun, Beijing (CN); Xiao Feng, Beijing (CN); Zhi Li, Beijing (CN)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/520,745

(22) Filed: Nov. 8, 2021

(65) Prior Publication Data
US 2022/0342009 A1   Oct. 27, 2022

(30) Foreign Application Priority Data
Apr. 26, 2021 (CN) .......................... 202110451626.4

(51) Int. Cl.
*G01R 33/04* (2006.01)
*G01R 33/02* (2006.01)
(Continued)

(52) U.S. Cl.
CPC ............. *G01R 33/04* (2013.01); *G01R 33/02* (2013.01); *G01R 33/0206* (2013.01);
(Continued)

(58) Field of Classification Search
CPC .. G01R 33/04; G01R 33/0206; G01R 33/045; G01R 33/02; G01C 17/30; G01C 17/28; G01C 17/38
(Continued)

(56) References Cited

U.S. PATENT DOCUMENTS

| 2003/0094942 A1* | 5/2003 | Friend | G01R 33/0206 |
| | | | 324/244 |
| 2004/0080316 A1* | 4/2004 | Friend | G01R 33/0206 |
| | | | 33/319 |

(Continued)

FOREIGN PATENT DOCUMENTS

| CN | 1605030 A | 4/2005 |
| CN | 101477181 A | 7/2009 |

(Continued)

OTHER PUBLICATIONS

Title of the article: Research on geomagnetic tensor measurement technology Based on Fluxgate Magnetometer Journal Title: Chinese Master's Theses Full-text Database Basic Sciences name of the author:Yuchen Du issue date:Aug. 31, 2019 pp. A011-140.

*Primary Examiner* — Raul J Rios Russo

(57) ABSTRACT

An offset data acquisition method and device of a fluxgate magnetometer are provided by the present disclosure, wherein the offset data acquisition method of the fluxgate magnetometer comprises: controlling the first analog switch, the second analog switch and the third analog switch to change directions within a preset period to obtain eight switch direction combinations between the first analog switch, the second analog switch and the third analog switch; acquiring magnetic field measurement data corresponding to an each of the switch direction combinations; and the magnetic field measurement data comprises x-axis magnetic field measurement data, y-axis magnetic field measurement data and z-axis magnetic field measurement
(Continued)

data; and acquiring the offset data based on influence factors of an offset and the magnetic field measurement data within the preset period.

10 Claims, 6 Drawing Sheets

(51) Int. Cl.
*G01C 17/30* (2006.01)
*G01C 17/28* (2006.01)
*G01C 17/38* (2006.01)

(52) U.S. Cl.
CPC ............ *G01R 33/045* (2013.01); *G01C 17/28* (2013.01); *G01C 17/30* (2013.01); *G01C 17/38* (2013.01)

(58) Field of Classification Search
USPC .... 324/51, 55, 200, 227, 228, 236, 244, 253
See application file for complete search history.

(56) References Cited

U.S. PATENT DOCUMENTS

| | | | |
|---|---|---|---|
| 2005/0194972 A1* | 9/2005 | Goldenberg | G01R 33/04 324/225 |
| 2013/0049749 A1* | 2/2013 | Mohan | G01R 33/04 324/252 |
| 2017/0299666 A1* | 10/2017 | Williams | G01R 33/04 |
| 2019/0041469 A1* | 2/2019 | Li | G01R 33/0017 |

FOREIGN PATENT DOCUMENTS

| | | |
|---|---|---|
| CN | 105203971 A | 12/2015 |
| CN | 108983123 A | 12/2018 |

\* cited by examiner

METHOD AND DEVICE FOR ELIMINATING OFFSET OF FLUXGATE MAGNETOMETER

CROSS-REFERENCE TO RELATED APPLICATIONS

The application claims priority to Chinese patent application No. 202110451626.4, filed on Apr. 26, 2021, the entire contents of which are incorporated herein by reference.

TECHNICAL FIELD

The present disclosure relates to the technical field of measuring magnetic variables, in particular to a method and device for eliminating offset of a fluxgate magnetometer.

BACKGROUND

Fluxgate magnetometer is the main instrument of satellite in-orbit magnetic field measurement, which can measure three-component space vector magnetic field. Although fluxgate has the advantages of low power consumption, small volume, high accuracy and high reliability, it has offset, which is hereinafter referred to as offset. The zero point of fluxgate magnetometer will drift with time, temperature, mechanical stress and electromagnetic environment. Moreover, this kind of change is often the non-linear, and random to a certain extent. Severe offset may lead to poor reliability and consistency of magnetometer data, and affect the accuracy and continuity of corresponding data analysis. In the application scenarios of pursuing high-precision magnetic fields, such as magnetic anomaly investigation and magnetic field fluctuation monitoring, offset must be eliminated or actually determined. When fluxgate magnetometers are used in ground or aviation environments, their offset can be eliminated by periodic, manual calibrations. However, the fluxgate magnetometer installed on artificial satellites, especially fluxgate magnetometers mounted on the interplanetary probes, could not be maintained manually due to its distance from Earth. In this kind of application scenarios, it is necessary to adopt other correction and calibration methods to eliminate offset.

At present, there are three types of methods for measuring fluxgate magnetometer in orbit.

The first type of methods is to use the characteristics of the space magnetic field where the satellite is located, such as the mirror mode magnetic field fluctuations in the planetary magnetosphere, or the Alfven wave in the interplanetary magnetic field. These methods require the satellite itself to operate in environments where such specific characteristics may exist for a long time. The second is in-orbit calibration using other instruments carried by the satellite. The satellite itself may carry other magnetic field measuring payloads with less theoretical offset, such as a scalar magnetometer based on the optical pump or proton precession principle. By comparing the data of scalar magnetometer and vector fluxgate magnetometer, the offset of fluxgate magnetometer can be eliminated to some extent. This method requires that the satellite must carry not less than two in-situ magnetic field measurement payloads. The third type is in-orbit calibration using the design of the satellite itself. Some satellites are rotationally stable, that is, they rotate about a specific axis. When the satellite rotates around the Z axis, the magnetic field measured by the fluxgate in the XY axis direction will change periodically, and the offset of the XY axis magnetic field measurement can be eliminated by using its periodic change. However, the offset of Z axis shall be solved separately.

Therefore, eliminating the offset of the fluxgate magnetometer currently requires more stringent external conditions and could not fulfill budget interplanetary missions.

SUMMARY

In view of the above problems, the present disclosure proposes a method and device for eliminating offset of a fluxgate magnetometer. When implemented, the requirements for external conditions are low, the scope of application is larger, and can be effectively applied to interplanetary equipment.

In the first aspect, the present application provides the following technical solution through an embodiment:

an offset data acquisition method of a fluxgate magnetometer, wherein: the offset data acquisition method of the fluxgate magnetometer is applied to the fluxgate magnetometer, the fluxgate magnetometer comprises: a probe, a feedback module, an excitation module, and a sensing module; a first analog switch is provided between the probe and the feedback module, a second analog switch is provided between the probe and the excitation module, and a third analog switch is provided between the probe and the sensing module; the offset data acquisition method of the fluxgate magnetometer comprises:

controlling the first analog switch, the second analog switch and the third analog switch to change directions within a preset period to obtain eight switch direction combinations between the first analog switch, the second analog switch and the third analog switch; acquiring magnetic field measurement data corresponding to an each of the switch direction combinations; and the magnetic field measurement data comprises x-axis magnetic field measurement data, y-axis magnetic field measurement data and z-axis magnetic field measurement data; and acquiring the offset data based on influence factors of an offset and the magnetic field measurement data within the preset period, wherein the influence factors include residual magnetism of the probe and environment, coupling leakage of an excitation signal in the probe, a parasitic capacitance effect of the probe, distortion of a probe induced signal, imbalance of an induced signal processing circuit and imbalance of a feedback signal processing circuit.

Preferably, acquiring the magnetic field measurement data corresponding to the each of the switch direction combinations, comprising:

acquiring the magnetic field measurement data corresponding to the each of the switch direction combinations, comprising: acquiring first magnetic field measurement data when the first analog switch, the second analog switch, and the third analog switch are all in a first direction; acquiring second magnetic field measurement data when the first analog switch is in the first direction and the second analog switch and the third analog switch are in a second direction; acquiring third magnetic field measurement data when the second analog switch is in the first direction and the first analog switch and the third analog switch are in the second direction; acquiring fourth magnetic field measurement data when the third analog switch is in the first direction and the first analog switch and the second analog switch are in the second direction; acquiring fifth magnetic field measurement data when the first analog switch and the second analog switch are in the first direction and the third analog switch is in the second direction; acquiring sixth magnetic field measurement data when the second analog switch and the third analog switch are in the first direction and the first analog switch is in the second direction; acquiring seventh magnetic field measurement data when the first analog switch and the third analog switch are in the first direction and the second analog switch is in the second direction; and acquiring eighth magnetic field measurement data when the first analog switch, the second analog switch, and the third analog switch are all in the second direction.

Preferably, acquiring the magnetic field measurement data corresponding to the each of the switch direction combinations, comprising:

acquiring the magnetic field measurement data corresponding to an one of the switch direction combinations in an each subperiod of the preset period to obtain the magnetic field measurement data corresponding to the each of the switch direction combinations, wherein the subperiod is ⅛ of the preset period.

Preferably, acquiring the magnetic field measurement data corresponding to the each of the switch direction combinations, comprising:

acquiring original measurement data corresponding to a target switch direction combination, wherein the target switch direction combination is an any one of the eight switch direction combinations; determining a defective signal in the original measurement data based on a time node of a switch commutation; and removing the defective signal from the original measurement data to obtain the magnetic field measurement data corresponding to the target switching direction combination.

Preferably, determining the defective signal in the original measurement data based on the time node, comprising:

determining the original measurement data within a preset time period after the time node as the defective signal.

Preferably, the preset time period is 0.0052s to 0.0056s.

In a second aspect, based on the same inventive concept, the present application provides the following technical solution through the embodiment:

an offset data acquisition device of the fluxgate magnetometer, wherein: the offset data acquisition device of the fluxgate magnetometer is applied to the fluxgate magnetometer, the fluxgate magnetometer comprises: the probe, the feedback module, the excitation module, and the sensing module; the first analog switch is provided between the probe and the feedback module, the second analog switch is provided between the probe and the excitation module, and the third analog switch is provided between the probe and the sensing module; the offset data acquisition device of the fluxgate magnetometer comprises:

a timer module, configured to control the first analog switch, the second analog switch and the third analog switch to change the directions within the preset period to obtain the eight switch direction combinations between the first analog switch, the second analog switch and the third analog switch; a data acquisition module, configured to acquire the magnetic field measurement data corresponding to the each of the switch direction combinations; and the magnetic field measurement data comprises the x-axis magnetic field measurement data, the y-axis magnetic field measurement data and the z-axis magnetic field measurement data; and an offset calculation module, configured to acquire the offset data based on influence factors of the offset and the magnetic field measurement data within the preset period, wherein the influence factors include the residual magnetism of the probe and the environment, the coupling leakage of the excitation signal in the probe, the parasitic capacitance effect of the probe, the distortion of the probe induced signal, the imbalance of the induced signal processing circuit and the imbalance of the feedback signal processing circuit.

Preferably, the data acquisition module is applied to:

acquire the magnetic field measurement data corresponding to the each of the switch direction combinations, comprising: acquire the first magnetic field measurement data when the first analog switch, the second analog switch, and the third analog switch are all in the first direction; acquire the second magnetic field measurement data when the first analog switch is in the first direction and the second analog switch and the third analog switch are in the second direction; acquire the third magnetic field measurement data when the second analog switch is in the first direction and the first analog switch and the third analog switch are in the second direction; acquire the fourth magnetic field measurement data when the third analog switch is in the first direction and the first analog switch and the second analog switch are in the second direction; acquire the fifth magnetic field measurement data when the first analog switch and the second analog switch are in the first direction and the third analog switch is in the second direction; acquire the sixth magnetic field measurement data when the second analog switch and the third analog switch are in the first direction and the first analog switch is in the second direction; acquire the seventh magnetic field measurement data when the first analog switch and the third analog switch are in the first direction and the second analog switch is in the second direction; and acquire the eighth magnetic field measurement data when the first analog switch, the second analog switch, and the third analog switch are all in the second direction.

In a third aspect, based on the same inventive concept, the present application provides the following technical solution through the embodiment:

the fluxgate magnetometer comprises the probe, the feedback module, the excitation module, the sensing module and a comprehensive controller; the first analog switch is provided between the probe and the feedback module, the second analog switch is provided between the probe and the excitation module, and the second analog switch is provided between the probe and the sensing module; the comprehensive controller is configured to perform a direction control on the first analog switch, the second analog switch and the third analog switch.

In a fourth aspect, based on the same inventive concept, the present application provides the following technical solution through the embodiment:

a computer readable storage medium on which a computer program is stored, wherein the computer program is executed by a processor in steps of implementing the offset data acquisition method of the fluxgate magnetometer according to the first aspect.

The offset data acquisition method and device of the fluxgate magnetometer are provided by the present disclosure, wherein the offset data acquisition method of the fluxgate magnetometer comprises: controlling the first analog switch, the second analog switch and the third analog switch to change directions within the preset period to obtain the eight switch direction combinations between the first analog switch, the second analog switch and the third analog switch; acquiring the magnetic field measurement data corresponding to the each of the switch direction combinations; and the magnetic field measurement data comprises the x-axis magnetic field measurement data, the y-axis magnetic field measurement data and the z-axis magnetic field measurement data; and acquiring the offset data based on the influence factors of the offset and the magnetic field measurement data within the preset period. The offset data obtained can be used to correct the data measured by the fluxgate magnetometer. Moreover, the acquisition of offset data requires little hardware modification and low cost, and is more suitable for different external environments and can be effectively used in interplanetary equipment.

The above description is merely an outline of the technical solution of the present disclosure, and may be implemented according to the contents of the description in order to be able to understand the technical means of the present disclosure more clearly, and in order to make the above and other objects, features and advantages of the present disclosure more obvious and easy to understand, specific embodiments of the present disclosure are listed below.

BRIEF DESCRIPTION OF DRAWINGS

In order to explain the technical solution in the embodiments of the present disclosure more clearly, the following will give a brief introduction to the accompanying drawings to be used in the description of the embodiments. It is obvious that the accompanying drawings in the following description are some embodiments of the present disclosure. For those of ordinary skill in the art, other accompanying drawings can be obtained according to the accompanying drawings without any creative work. In the attached drawings.

DETAILED DESCRIPTION OF THE EMBODIMENTS

Figure 1:
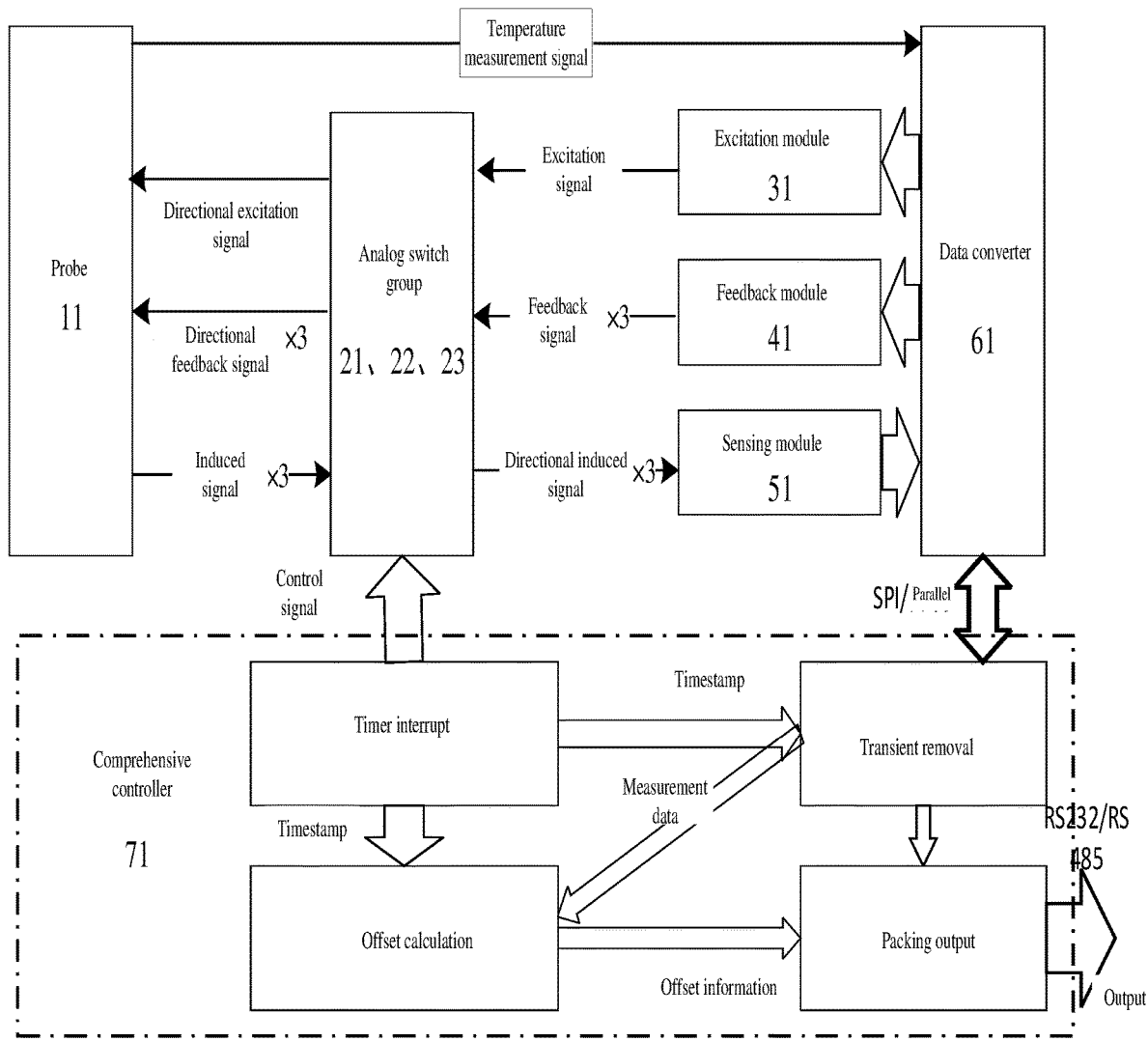
FIG. 1 is a schematic diagram of a fluxgate magnetometer provided by the embodiment of the present disclosure.

Exemplary embodiments of the present disclosure will be described in more detail below with reference to the drawings. Although exemplary embodiments of the present disclosure are shown in the drawings, it should be understood that the present disclosure may be implemented in various forms and should not be limited by the embodiments set forth herein. On the contrary, these embodiments are provided to enable a more thorough understanding of the disclosure and to enable the scope of the disclosure to be communicated in its entirety to those skilled in the art.

Referring to FIG. 1, the fluxgate magnetometer according to the embodiment of the present disclosure is shown, comprising a probe 11, a feedback module 41, an excitation module 31, a sensing module 51, a data converter 61, and a comprehensive controller 71. A first analog switch 21 is provided between the probe 11 and the feedback module 41, a second analog switch 22 is provided between the probe 11 and the excitation module 31, and the second analog switch 22 is provided between the probe 11 and the sensing module 51; the comprehensive controller 71 is used for direction control of the first analog switch 21, the second analog switch 22, and the third analog switch 23.

The probe 11 is used for sensing magnetic field data, and the induced signal is transmitted to the sensing module 51 through the third analog switch 23. The sensing module 51 performs preliminary processing on the induced signal and then transmits the induced signal to the data converter 61 for signal conversion to convert the analog signal into a digital signal. The data converter 61 can also generate an excitation signal, which is processed by the excitation module 31 and transmitted to the probe 11 for driving the probe 11 to operate. The data converter 61 can also be used to generate a feedback signal, and the feedback module 41 transmits the processed feedback signal to the probe 11 to cancel the magnetic field strength in the space where the probe 11 is located, so as to ensure that the probe 11 of the fluxgate magnetometer always operates in a small dynamic range. The data converter 61 may be controlled by the comprehensive controller 71. The data converter 61 may include an analog-to-digital converter (ADC) and a digital-to-analog converter (DAC), the ADC being responsible for converting the analog induced voltage signal measured by the probe 11 into a digital signal to be sent to the comprehensive controller 71, and the DAC being responsible for converting the digital signal of the comprehensive controller 71 into an analog signal, including an excitation current signal and a feedback current signal. The data converter 61 may communicate data with the comprehensive controller 71 via different data protocols, such as the IIC (Inter-Integrated Circuit, Bus) protocol, the SPI (Serial Peripheral Interface) protocol, the parallel transmission protocol, and the like.

Figure 2:
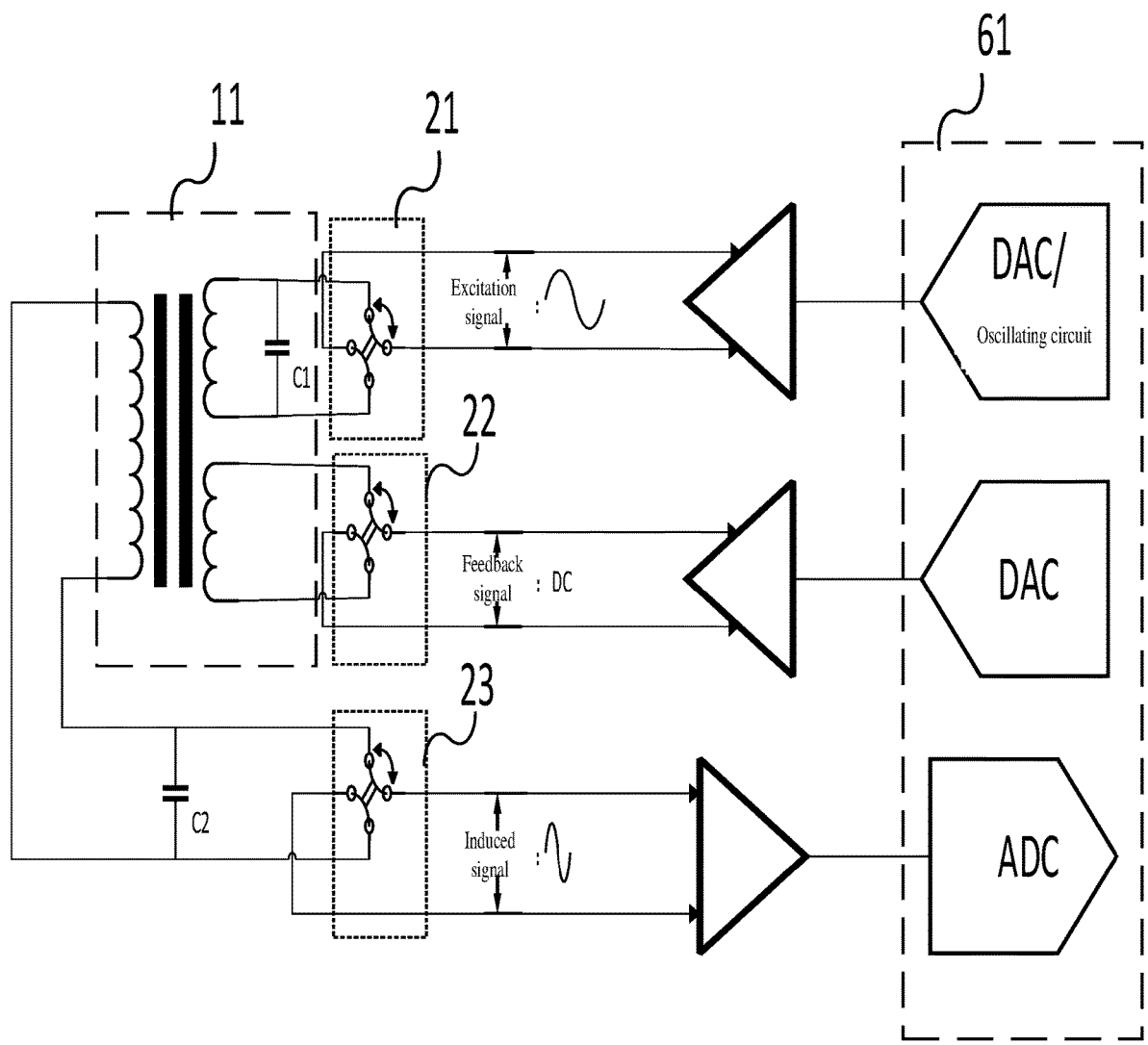
FIG. 2 is another schematic diagram of the fluxgate magnetometer provided by the embodiment of the present disclosure.

Referring to FIG. 2, the analog switch is a double-pole, double-throw switch for commutation of signal polarity. When the comprehensive controller 71 controls the first analog switch 21, the polarity of the feedback signal can be reversed. When the comprehensive controller 71 controls the second analog switch 22, the polarity of the excitation signal can be reversed. When the comprehensive controller 71 controls the third analog switch 23, the polarity of the induction signal can be reversed. The comprehensive controller 71 may periodically control the first analog switch 21, the second analog switch 22, and the third analog switch 23. The first analog switch 21, the second analog switch 22 and the third analog switch 23 may form eight kinds of open direction combinations, and the comprehensive controller 71 controls the analog switch periodically through the control signal. For example, one switch combination is maintained for every ⅛ preset period, and one preset period forms 8 subperiods, and the magnetic field data is collected respectively in the case of 8 direction combinations; that is, in each subperiod of the preset period, the magnetic field measurement data corresponding to one switch direction combination is collected to obtain the magnetic field measurement data corresponding to each switch direction combination.

Figure 3:
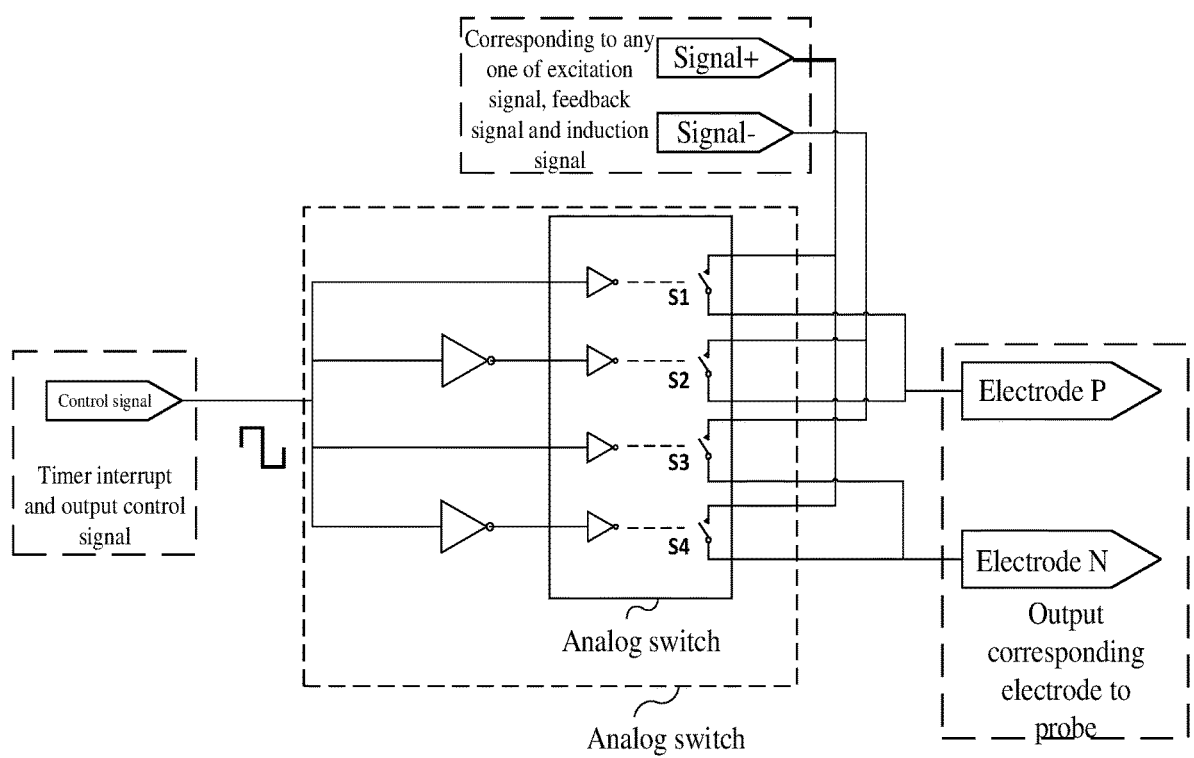
FIG. 3 is schematic diagram of connection structure of analog switches provided by the embodiment of the present disclosure.

In the present embodiment, the control principle among the analog switch, the probe 11, the feedback module 41, the excitation module 31, the sensing module 51, and the comprehensive controller 71 is shown in FIG. 3.

Based on the description of FIG. 3, only an exemplary description is provided, and the specific circuit structure thereof can be changed adaptively, and is not limited to the illustrated structure, and the operation principle of any one of the first, second and third analog switches 21, 22 and 23 is shown in FIG. 3. Since the induced signal, the feedback signal and the excitation signal are all differential signals, each analog switch contains four analog switches for ease of illustration, indicated by "signal-" and "signal+" in FIG. 3.

Specifically, the timer in the comprehensive controller 71 interrupts and outputs a control signal, which is a square wave signal, and the control signal is divided into four channels to four analog switches. The closing and conduction of the four analog switches are realized through the high and low levels, among which, at the high level, the analog switch is closed and the circuit is conducted; at the low level, the analog switch is opened and the circuit is open. When the control signal is high, the analog switches S1 and S3 are closed, and S2 and S4 are opened; at this time, "signal+" flows to "electrode P" of the probe 11, and "signal-" flows to "electrode N" of the probe 11. When the control signal is low, the analog switches S1 and S3 are disconnected, S2 and S4 are closed, "signal+" flows to the "electrode N" of the probe 11, and "signal-" flows to the "electrode P" of the probe 11 to realize direction exchange.

Figure 4:
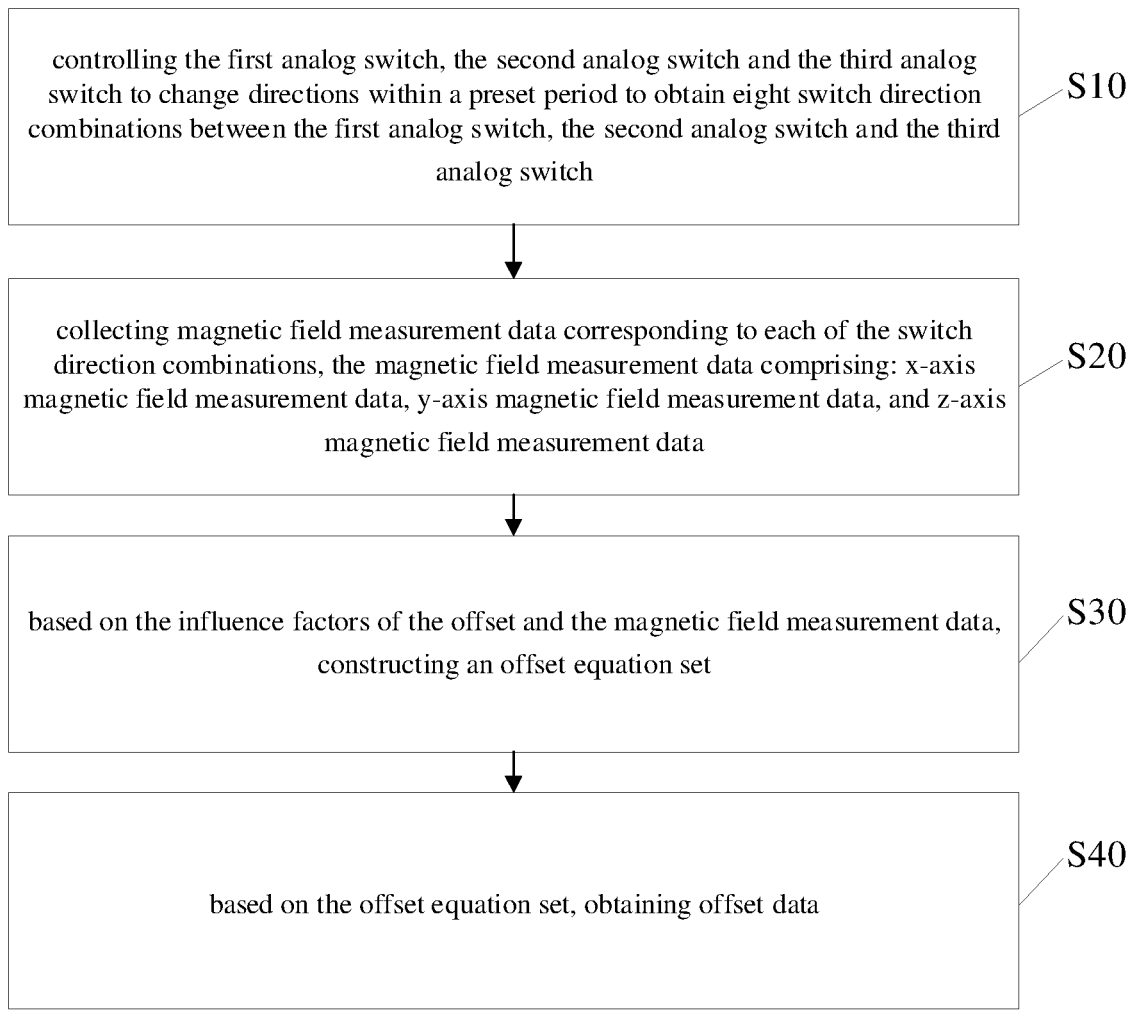
FIG. 4 is a flow chart of the offset data acquisition method of the fluxgate magnetometer provided by another embodiment of the present disclosure.

Referring to FIG. 4, the offset data acquisition method for the fluxgate magnetometer is provided in another embodiment of the present disclosure, and is applicable to the fluxgate magnetometer described above, and can be executed by a comprehensive controller.

What needed to be explained is that when the fluxgate magnetometer is used in interplanetary probes such as satellites and space probes, the trigger of the above method could be triggered automatically by the built-in program periodically, or it could be triggered automatically when the ground telemetry believed that offset calibration was necessary. Specific methods include:

step S10: controlling the first analog switch, the second analog switch and the third analog switch to change directions within a preset period to obtain eight switch direction combinations between the first analog switch, the second analog switch and the third analog switch.

In the step S10, the timer in the comprehensive controller interrupts the timing to send the control signal to the analog switch, and controls the eight switch direction combinations to change periodically. The order of change of the switch combination is not limited.

Step S20: collecting magnetic field measurement data corresponding to each of the switch direction combinations, the magnetic field measurement data comprising: x-axis magnetic field measurement data, y-axis magnetic field measurement data, and z-axis magnetic field measurement data.

In the step S20, when a switch direction combination is obtained after the analog switch direction conversion, the magnetic field data can be collected for a certain period of time under the switch direction combination. The acquisition time corresponding to each switch direction combination may be the same or different.

When the acquisition time is the same, the combination of eight directions is a preset cycle, and each switch direction combination can acquire ⅛ preset cycle, for example, ⅛ preset cycle can be 5s to 15s, when one cycle is 80s, one switch direction combination can acquire 10s. Specifically, the magnetic field data acquisition time includes the following eight cases:

1, acquiring first magnetic field measurement data when the first analog switch, the second analog switch, and the third analog switch are all in a first direction;

2, acquiring second magnetic field measurement data when the first analog switch is in the first direction and the second analog switch and the third analog switch are in a second direction;

3, acquiring third magnetic field measurement data when the second analog switch is in the first direction and the first analog switch and the third analog switch are in the second direction;

4, acquiring fourth magnetic field measurement data when the third analog switch is in the first direction and the first analog switch and the second analog switch are in the second direction;

5, acquiring fifth magnetic field measurement data when the first analog switch and the second analog switch are in the first direction and the third analog switch is in the second direction;

6, acquiring sixth magnetic field measurement data when the second analog switch and the third analog switch are in the first direction and the first analog switch is in the second direction;

7, acquiring seventh magnetic field measurement data when the first analog switch and the third analog switch are in the first direction and the second analog switch is in the second direction; and 8, acquiring eighth magnetic field measurement data when the first analog switch, the second analog switch, and the third analog switch are all in the second direction.

The first direction and the second direction in the above may determine that any direction is a forward direction, and the other direction is a reverse direction. The first to eighth magnetic field measurements include x-axis magnetic field measurements, y-axis magnetic field measurements, and z-axis magnetic field measurements.

Figure 5:
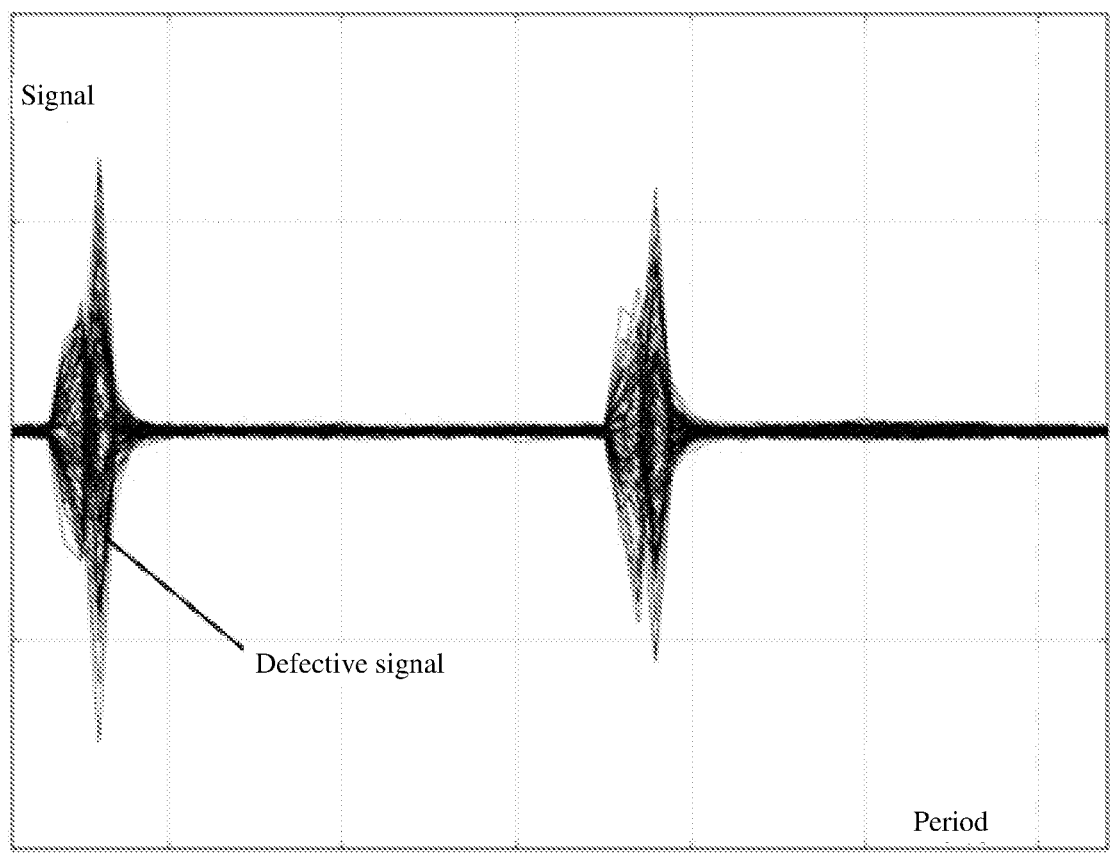
FIG. 5 is a schematic diagram of periodically generating defective signals in another embodiment of the present disclosure.
Figure 6:
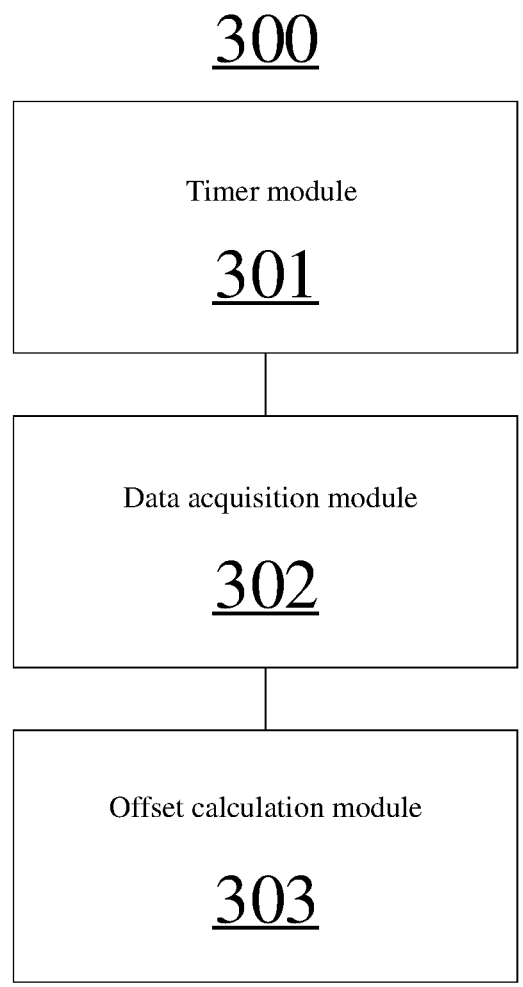
FIG. 6 is a structure diagram of the offset data acquisition device of the fluxgate magnetometer provided by another embodiment of the present disclosure.

Signal fluctuation and instability will be caused at the moment of analog switch direction switching, as shown in FIG. 5. In order to avoid the application of the defective signal to the subsequent offset acquisition step, the defective signal may also be processed and removed during the acquisition of the magnetic field measurement data in step S20. The removal process is as follows:

at first, acquiring original measurement data corresponding to a target switch direction combination, wherein the target switch direction combination is an any one of the eight switch direction combinations; then, determining a defective signal in the original measurement data based on a time node of a switch commutation; and the time node is the time point when the integrated controller controls the NC switch to the target switch direction combination, and the measurement data near the time node may be distorted. In the present embodiment, data within a preset time period range before and after a time node may be taken as a defective signal. A large preset period may result in the deletion of the normal signal, and a small preset period may not completely remove the defective signal, thereby reducing the accuracy of obtaining the offset value. After testing, the method in this embodiment can determine a preset period of time as a value greater than 0.0051s, preferably any value between 0.0052 and 0.0056s, such as 0.0052s, 0.0053s, 0.0054s, 0.0056s, etc. When the preset time period is 0.0052s, a better effect can be achieved. For another example, when the excitation frequency of the applied fluxgate magnetometer is 9.6 kHz, the corresponding period of 50 signals is 1/9.6 k*50≈0.005208 s, i.e. about 0.0052s; the first 50 excitation signals can be determined as defective signals. Finally, the defective signal is removed from the original measurement data, and the corresponding magnetic field measurement data of the target switch direction combination is obtained.

Further, in this embodiment, in order to avoid the distortion of the final offset result caused by the fluctuation of the measurement data, the multi-frame data corresponding to each switching direction combination may be subjected to the averaging processing, thereby outputting one frame of magnetic field measurement data corresponding to the switching direction combination. For example, N-frame original measurement data corresponding to the target switch direction combination are collected within ⅛ preset period, and then the N-frame original measurement data are averaged to obtain 1 frame magnetic field measurement data. The defective signal can be removed before or after the mean processing, and the order of the mean processing and the defective signal removal is not limited.

Step S30: based on the influence factors of the offset and the magnetic field measurement data, constructing an offset equation set.

At step S30, it is found by analysis that there is an inevitable bias due to the probe itself, as well as the excitation signal, the induction signal, and the feedback signal. Specifically, the probe will generate offset due to internal mechanical defects, temperature change, material remanence, etc.; the excitation module will generate offset due to leakage of second harmonic; the sensing module, feedback module and data conversion module will also generate offset due to systematic errors such as internal operational amplifier, offset voltage of data converter, etc. Therefore, in this embodiment, the influencing factors include the residual magnetism of the probe and the environment, the coupling leakage of the excitation signal in the probe, the parasitic capacitance effect of the probe, the distortion of the probe induced signal, the imbalance of the induced signal processing circuit and the imbalance of the feedback signal processing circuit.

In the X axis, Y axis and Z axis of the fluxgate magnetometer, the Z axis is taken as an example. Eight combinations can be formed with 2 polarities of 3 groups of signals of the Z axis respectively, and eight magnetic field measurements can be formed under the assumption of the same real magnetic field value. The following offset equation set can be constructed:

$$\begin{cases} B_{+++} = B_{rem} + B_{leak} + B_{para} + B_{dis} + B_{sen} + B_{feed} + B_0 \\ B_{-++} = B_{rem} - B_{leak} - B_{para} + B_{dis} + B_{sen} + B_{feed} + B_0 \\ B_{+-+} = -B_{rem} + B_{leak} - B_{para} + B_{dis} + B_{sen} + B_{feed} + B_0 \\ B_{++-} = -B_{rem} + B_{leak} + B_{para} + B_{dis} + B_{sen} - B_{feed} + B_0 \\ B_{--+} = -B_{rem} - B_{leak} + B_{para} + B_{dis} - B_{sen} + B_{feed} + B_0 \\ B_{-+-} = -B_{rem} - B_{leak} - B_{para} + B_{dis} + B_{sen} - B_{feed} + B_0 \\ B_{+--} = B_{rem} + B_{leak} - B_{para} - B_{dis} - B_{sen} - B_{feed} + B_0 \\ B_{---} = B_{rem} - B_{leak} + B_{para} - B_{dis} - B_{sen} - B_{feed} + B_0 \end{cases}$$

wherein, the first positive sign of the angle mark of $B_{+++}$ represents the polarity of the excitation signal, the second positive sign represents the polarity of the induction signal, and the third positive sign represents the polarity of the feedback signal, which can be deduced in this way; $B_{rem}$ is the offset data caused by the residual magnetism of the probe and the environment, $B_{leak}$ is the offset data caused by the coupling leakage of the excitation signal in the probe, $B_{pam}$ is the offset data caused by the parasitic capacitance effect of the probe, $B_{dis}$ is the offset data caused by the distortion of the induction signal of the probe, and $B_{sen}$ is the offset data caused by the misalignment of the induction signal processing circuit. $B_{feed}$ is the offset data caused by feedback signal processing circuit misalignment, $B_0$ is the external real magnetic field. The offset data in this embodiment is offset data. Therefore, the offset can be divided into six parts by six influencing factors, and the unknown external real magnetic field $B_0$ is added to form seven elements to be solved, which are solved by seven element equations composed of eight equations. The above linear equations have a coefficient matrix rank of seven, so there must be a solution. It should be noted that the offset data acquisition mode corresponding to the X-axis and the Y-axis can be executed with reference to the offset data acquisition process of the Z-axis described above, and will not be repeated in this embodiment.

Step S40: based on the offset equation set, obtaining offset data.

In step S40, the offset data generated by six influencing factors can be obtained by solving the offset equation group. That is, offset data corresponds to six parts of $B_{rem}$, $B_{leak}$, $B_{pam}$, $B_{dis}$, $B_{sen}$ and $B_{feed}$. Finally, the measured external magnetic field and six parts of offset data can be packaged and output by the integrated controller, and the measured data of fluxgate magnetometer can be corrected by the upper computer based on the offset data.

The offset data acquisition method of the fluxgate magnetometer provided in this embodiment may be used to acquire offset data for correcting the fluxgate magnetometer. Compared to the offset elimination scheme of the existing on-board fluxgate magnetometer, this method did not require the interplanetary detector to carry other magnetic field measuring instruments. It did not require the interplanetary detector to work in a special environment for a long time, nor did it require the interplanetary detector to have a specific rotational stability. It can be seen that the method of this embodiment has low requirements on external conditions and has a larger scope of application. It can be effectively applied to interplanetary equipment. Not only that, the method of this embodiment does not have mutual repellency with the prior art solution, but can exist at the same time, and is applied to the offset correction of the fluxgate magnetometer to form complementarity with other solutions, so as to improve the accuracy and reliability of the offset elimination. The method of the present embodiment has the advantages of small hardware modification requirements, low cost and reliable offset data obtained.

Referring to FIG. 5, an offset data acquisition device 300 of the fluxgate magnetometer is provided in another embodiment of the present disclosure based on the same inventive concept. The offset data acquisition device of the fluxgate magnetometer can be applied to the fluxgate magnetometer, the fluxgate magnetometer comprises: the probe, the feedback module, the excitation module, and the sensing module; the first analog switch is provided between the probe and the feedback module, the second analog switch is provided between the probe and the excitation module, and the third analog switch is provided between the probe and the sensing module; the offset data acquisition device 300 of the fluxgate magnetometer comprises:

a timer module 301, configured to control the first analog switch, the second analog switch and the third analog switch to change the directions within the preset period to obtain the eight switch direction combinations between the first analog switch, the second analog switch and the third analog switch; a data acquisition module 302, configured to acquire the magnetic field measurement data corresponding to the each of the switch direction combinations; and the magnetic field measurement data comprises the x-axis magnetic field measurement data, the y-axis magnetic field measurement data and the z-axis magnetic field measurement data; and an offset calculation module 303, configured to acquire the offset data based on influence factors of the offset and the magnetic field measurement data within the preset period, wherein the influence factors include the residual magnetism of the probe and the environment, the coupling leakage of the excitation signal in the probe, the parasitic capacitance effect of the probe, the distortion of the probe induced signal, the imbalance of the induced signal processing circuit and the imbalance of the feedback signal processing circuit.

As an alternative embodiment, the data acquisition module 302 is specifically applied to:

acquire the magnetic field measurement data corresponding to the each of the switch direction combinations, comprising: acquire the first magnetic field measurement data when the first analog switch, the second analog switch, and the third analog switch are all in the first direction; acquire the second magnetic field measurement data when the first analog switch is in the first direction and the second analog switch and the third analog switch are in the second direction; acquire the third magnetic field measurement data when the second analog switch is in the first direction and the first analog switch and the third analog switch are in the second direction; acquire the fourth magnetic field measurement data when the third analog switch is in the first direction and the first analog switch and the second analog switch are in the second direction; acquire the fifth magnetic field measurement data when the first analog switch and the second analog switch are in the first direction and the third analog switch is in the second direction; acquire the sixth magnetic field measurement data when the second analog switch and the third analog switch are in the first direction and the first analog switch is in the second direction; acquire the seventh magnetic field measurement data when the first analog switch and the third analog switch are in the first direction and the second analog switch is in the second direction; and acquire the eighth magnetic field measurement data when the first analog switch, the second analog switch, and the third analog switch are all in the second direction.

As the alternative embodiment, the data acquisition module 302 is also specifically applied to:

acquire the magnetic field measurement data corresponding to an one of the switch direction combinations in an each subperiod of the preset period to obtain the magnetic field measurement data corresponding to the each of the switch direction combinations, wherein the subperiod is ⅛ of the preset period.

As the alternative embodiment, the data acquisition module 302 is also specifically applied to:

acquire original measurement data corresponding to a target switch direction combination, wherein the target switch direction combination is an any one of the eight switch direction combinations; determine a defective signal in the original measurement data based on a time node of a switch commutation; and remove the defective signal from the original measurement data to obtain the magnetic field measurement data corresponding to the target switching direction combination.

As the alternative embodiment, the data acquisition module 302 is also specifically applied to:

determine the original measurement data within a preset time period after the time node as the defective signal.

As the alternative embodiment, the data acquisition module 302 is also specifically applied to:

the preset time period is 0.0052s to 0.0056s.

It should be noted that the offset data acquisition device 300 of the fluxgate magnetometer provided in the embodiment of the present disclosure provided in the embodiment of the present disclosure are the same as those in the embodiment of the method described above. For brief description, the device embodiment may refer to the corresponding contents in the embodiment of the method described above.

Based on the same inventive concept, a further embodiment of the present disclosure also provides a computer readable storage medium on which a computer program is stored, and the computer program is executed by a processor in steps of implementing the offset data acquisition method of the fluxgate magnetometer according to the steps of any of the aforementioned method embodiments.

It should be noted that in the computer-readable storage medium provided in the embodiment of the present disclosure, the specific implementation and the technical effect produced by each step when the program is executed by the processor are the same as those in the embodiment of the method described above. For brief description, the contents not mentioned in the embodiment may be referred to the corresponding contents in the embodiment of the method described above The term "and/or" appearing in this article is only a description of the association relationship of the associated object, which means that there can be three kinds of relationships, for example, A and/or B, which can mean that A exists alone, A and B exist at the same time, and B exists alone. In addition, the character "/" herein generally indicates that the context-related object is an "or" relationship; the word "including" does not exclude the existence of elements or steps not listed in the claim. The word "one" or "an/a" preceding a component does not exclude the existence of more than one such component. The disclosure can be realized by means of hardware comprising several different elements and by means of a suitably programmed computer. In the unit claim in which several devices are enumerated, several of these devices may be embodied by the same hardware item. The use of the first, second, and third words does not represent any order. These words can be interpreted as names.

Those skilled in the art will appreciate that embodiments of the disclosure may be provided as methods, systems, or computer program products. Accordingly, the present disclosure may take the form of a full hardware embodiment, a full software embodiment, or an embodiment combining software and hardware aspects. Furthermore, the present disclosure may take the form of a computer program product implemented on one or more computer available storage media (including, but not limited to, disk memory, CD-ROM, optical memory, FLASH memory, EEPROM, etc.) containing computer available program code therein.

The disclosure is described with reference to flowcharts and/or block diagrams of methods, devices (systems), and computer program products according to embodiments of the disclosure. It should be understood that each flow and/or block in a flow chart and/or block diagram may be implemented by computer program instructions, and a combination of flow and/or blocks in the flow chart and/or block diagram. These computer program instructions may be provided to a processor of a general-purpose computer, a dedicated computer, an embedded processor, or other programmable data processing device to generate a machine such that instructions executed by a processor of a computer or other programmable data processing device generate means for implementing functions specified in one or more blocks of a flow chart or flows and/or block diagrams.

These computer program instructions may also be stored in a computer readable memory capable of directing a computer or other programmable data processing device to operate in a particular manner such that the instructions stored in the computer readable memory produce a manufactured article comprising an instruction device that implements a function specified in one or more blocks of a flow chart or flows and/or block diagrams.

These computer program instructions may also be loaded onto a computer or other programmable data processing device such that a series of operational steps are performed on the computer or other programmable device to produce computer-implemented processing such that instructions executed on the computer or other programmable device provide steps for implementing functions specified in one or more flowcharts and/or blockcharts.

Although preferred embodiments of the disclosure have been described, those skilled in the art may make additional changes and modifications to these embodiments once the basic inventive concepts are known. The appended claims are therefore intended to be construed as including preferred embodiments and all modifications and modifications falling within the scope of the disclosure.

It will be apparent to those skilled in the art that various modifications and modifications may be made to the disclosure without departing from the spirit and scope of the disclosure. Thus, if these modifications and variations of the disclosure fall within the scope of the claims of the disclosure and their equivalent, the disclosure is also intended to include these modifications and variations.

What is claimed is:

1. An offset data acquisition method of a fluxgate magnetometer, wherein: the offset data acquisition method of the fluxgate magnetometer is applied to the fluxgate magnetometer, the fluxgate magnetometer comprises: a probe, a feedback module, an excitation module, and a sensing module; a first analog switch is provided between the probe and the feedback module, a second analog switch is provided between the probe and the excitation module, and a third analog switch is provided between the probe and the sensing module; the offset data acquisition method of the fluxgate magnetometer comprises:

controlling the first analog switch, the second analog switch and the third analog switch to change directions within a preset period to obtain eight switch direction combinations between the first analog switch, the second analog switch and the third analog switch;

acquiring magnetic field measurement data corresponding to an each of the switch direction combinations; and the magnetic field measurement data comprises x-axis magnetic field measurement data, y-axis magnetic field measurement data and z-axis magnetic field measurement data; and acquiring the offset data based on influence factors of an offset and the magnetic field measurement data within the preset period, wherein the influence factors include residual magnetism of the probe and environment, coupling leakage of an excitation signal in the probe, a parasitic capacitance effect of the probe, distortion of a probe induced signal, imbalance of an induced signal processing circuit and imbalance of a feedback signal processing circuit.

2. The offset data acquisition method of the fluxgate magnetometer according to claim 1, wherein acquiring the magnetic field measurement data corresponding to the each of the switch direction combinations, comprising:

acquiring the magnetic field measurement data corresponding to the each of the switch direction combinations, comprising:

acquiring first magnetic field measurement data when the first analog switch, the second analog switch, and the third analog switch are all in a first direction;

acquiring second magnetic field measurement data when the first analog switch is in the first direction and the second analog switch and the third analog switch are in a second direction;

acquiring third magnetic field measurement data when the second analog switch is in the first direction and the first analog switch and the third analog switch are in the second direction;

acquiring fourth magnetic field measurement data when the third analog switch is in the first direction and the first analog switch and the second analog switch are in the second direction;

acquiring fifth magnetic field measurement data when the first analog switch and the second analog switch are in the first direction and the third analog switch is in the second direction;

acquiring sixth magnetic field measurement data when the second analog switch and the third analog switch are in the first direction and the first analog switch is in the second direction;

acquiring seventh magnetic field measurement data when the first analog switch and the third analog switch are in the first direction and the second analog switch is in the second direction; and acquiring eighth magnetic field measurement data when the first analog switch, the second analog switch, and the third analog switch are all in the second direction.

3. The offset data acquisition method of the fluxgate magnetometer according to claim 1, wherein acquiring the magnetic field measurement data corresponding to the each of the switch direction combinations, comprising:

acquiring the magnetic field measurement data corresponding to an one of the switch direction combinations in an each subperiod of the preset period to obtain the magnetic field measurement data corresponding to the each of the switch direction combinations, wherein the subperiod is ⅛ of the preset period.

4. The offset data acquisition method of the fluxgate magnetometer according to claim 1, wherein acquiring the magnetic field measurement data corresponding to the each of the switch direction combinations, comprising:

acquiring original measurement data corresponding to a target switch direction combination, wherein the target switch direction combination is an any one of the eight switch direction combinations;

determining a defective signal in the original measurement data based on a time node of a switch commutation; and removing the defective signal from the original measurement data to obtain the magnetic field measurement data corresponding to the target switching direction combination.

5. The offset data acquisition method of the fluxgate magnetometer according to claim 4, wherein determining the defective signal in the original measurement data based on the time node, comprising:

determining the original measurement data within a preset time period after the time node as the defective signal.

6. The offset data acquisition method of the fluxgate magnetometer according to claim 5, wherein: the preset time period is 0.0052s to 0.0056s.

7. The offset data acquisition method of the fluxgate magnetometer according to claim 1, wherein the fluxgate magnetometer comprises the probe, the feedback module, the excitation module, the sensing module and a comprehensive controller; the first analog switch is provided between the probe and the feedback module, the second analog switch is provided between the probe and the excitation module, and the second analog switch is provided between the probe and the sensing module; the comprehensive controller is configured to perform a direction control on the first analog switch, the second analog switch and the third analog switch.

8. A non-transitory computer readable storage medium on which a computer program is stored, wherein the computer program is executed by a processor in steps of implementing the offset data acquisition method of the fluxgate magnetometer according to claim 1.

9. An offset data acquisition device of a fluxgate magnetometer, wherein:
   the offset data acquisition device of the fluxgate magnetometer is applied to the fluxgate magnetometer, the fluxgate magnetometer comprises: a probe, a the feedback module, an excitation module, and a sensing module; a first analog switch is provided between the probe and the feedback module, the second analog switch is provided between the probe and the excitation module, and a third analog switch is provided between the probe and the sensing module; the fluxgate magnetometer further comprises a comprehensive controller wherein:
   a timer module, configured in the comprehensive controller, controls the first analog switch, the second analog switch and the third analog switch to change the directions within a preset period to obtain the eight switch direction combinations between the first analog switch, the second analog switch and the third analog switch;
   a data acquisition module, configured in the comprehensive controller, acquires a magnetic field measurement data corresponding to the each of the switch direction combinations; and the magnetic field measurement data comprises an x-axis magnetic field measurement data, a y-axis magnetic field measurement data and a z-axis magnetic field measurement data; and
   an offset calculation module, configured in the comprehensive controller, acquires the offset data based on influence factors of the offset and the magnetic field measurement data within the preset period, wherein the influence factors include a residual magnetism of the probe and the environment, a coupling leakage of the excitation signal in the probe, the parasitic capacitance effect of the probe, a distortion of the probe induced signal, the imbalance of the induced signal processing circuit and the imbalance of the feedback signal processing circuit.

10. The offset data acquisition device of the fluxgate magnetometer according to claim 9, wherein: the data acquisition module is applied to:
   acquire the magnetic field measurement data corresponding to the each of the switch direction combinations, comprising:
   acquire the first magnetic field measurement data when the first analog switch, the second analog switch, and the third analog switch are all in the first direction;
   acquire the second magnetic field measurement data when the first analog switch is in the first direction and the second analog switch and the third analog switch are in the second direction;
   acquire the third magnetic field measurement data when the second analog switch is in the first direction and the first analog switch and the third analog switch are in the second direction;
   acquire the fourth magnetic field measurement data when the third analog switch is in the first direction and the first analog switch and the second analog switch are in the second direction;
   acquire the fifth magnetic field measurement data when the first analog switch and the second analog switch are in the first direction and the third analog switch is in the second direction;
   acquire the sixth magnetic field measurement data when the second analog switch and the third analog switch are in the first direction and the first analog switch is in the second direction;
   acquire the seventh magnetic field measurement data when the first analog switch and the third analog switch are in the first direction and the second analog switch is in the second direction; and
   acquire the eighth magnetic field measurement data when the first analog switch, the second analog switch, and the third analog switch are all in the second direction.

* * * * *